(12) United States Patent
McReynolds

(10) Patent No.: US 6,191,043 B1
(45) Date of Patent: Feb. 20, 2001

(54) MECHANISM FOR ETCHING A SILICON LAYER IN A PLASMA PROCESSING CHAMBER TO FORM DEEP OPENINGS

(75) Inventor: Darrell McReynolds, Phoenix, AZ (US)

(73) Assignee: Lam Research Corporation, Fremont, CA (US)

( * ) Notice: Under 35 U.S.C. 154(b), the term of this patent shall be extended for 0 days.

(21) Appl. No.: 09/295,634

(22) Filed: Apr. 20, 1999

(51) Int. Cl.[7] .................. H01L 21/311; H01L 21/461
(52) U.S. Cl. .................. 438/710; 438/714; 438/719; 438/734
(58) Field of Search .................. 438/700, 701, 438/706, 707, 712, 719, 734, 735, 710, 714

(56) References Cited

U.S. PATENT DOCUMENTS

| | | | |
|---|---|---|---|
| 4,702,795 | * 10/1987 | Douglas | 438/695 |
| 4,726,879 | 2/1988 | Bondur et al. | 156/643 |
| 4,992,134 | * 2/1991 | Gupta et al. | 438/714 |
| 5,047,115 | * 3/2000 | Charlet et al. | 216/64 |
| 5,296,095 | * 3/1994 | Nabeshima et al. | 216/67 |
| 5,356,515 | * 10/1994 | Tahara et al. | 438/715 |
| 5,843,226 | * 12/1998 | Zhao et al. | 216/79 |
| 5,933,748 | * 8/1999 | Chou et al. | 438/692 |
| 6,033,991 | * 3/2000 | Ramkumar et al. | 438/713 |

OTHER PUBLICATIONS

International Searching Authority, European Patent Office, International Search Report dated Jul. 31, 2000, 5 pages.

* cited by examiner

Primary Examiner—Benjamin L. Utech
Assistant Examiner—Duy-Vu Deo
(74) Attorney, Agent, or Firm—Beyer Weaver & Thomas, LLP

(57) ABSTRACT

A method of etching a silicon layer in a plasma etching reactor to form an ultra deep opening is disclosed. The method includes the steps of providing a semiconductor substrate including the silicon layer into the plasma etching reactor and flowing an etching gas that includes an oxygen reactant gas, a helium gas, and an inert bombardment-enhancing gas into the plasma etching reactor. The method further includes striking a plasma using the etchant gas chemistry, and then providing an additive gas having $SF_6$ into the plasma etching reactor subsequent to striking the plasma. The method continues with etching an opening at least partially through the silicon layer using this plasma.

5 Claims, 7 Drawing Sheets

MECHANISM FOR ETCHING A SILICON LAYER IN A PLASMA PROCESSING CHAMBER TO FORM DEEP OPENINGS

BACKGROUND OF THE INVENTION

This invention relates to the fabrication of semiconductor integrated circuits (ICs). More particularly, the present invention relates to improved methods for etching a silicon layer in a plasma processing chamber to form deep openings having high aspect ratios.

In semiconductor IC fabrication, devices such as component transistors may be formed on a semiconductor wafer or substrate, which is typically made of silicon. Deep openings, which may have aspect ratios higher than 35:1, may be etched in the silicon for the purposes of, by way of example, storage, forming isolated capacitors or in MEM device applications. Openings having etch depths of about 3 $\mu$m to about 10 $\mu$m may be termed as deep openings, whereas openings having etch depths of more than about 10 $\mu$m may be termed as ultra deep openings. These ranges are provided as a guide to explaining the invention, and are not intended to define any limitations to the invention. For example, it is assumed that a method for etching an ultra deep opening would be equally effective for etching a more shallow opening.

To facilitate this discussion, FIG. 1 shows the steps involved in a prior art method of etching deep openings that utilizes a prior art etching gas chemistry. This prior art method starts at 102 when a substrate is provided in a plasma processing chamber and begins with an initial breakthrough etch using a fluorine chemistry in 104, which may be, by way of example, CF4. This initial etch phase is followed by preparations for the main etch step, which starts at 106 by providing an $SF_6/O_2/He$ etchant gas chemistry and striking a plasma using this gas chemistry in 108. Then the main etch starts in 110 by using the plasma to etch a deep opening in a silicon layer, for example, a trench having a depth of approximately 5.5 $\mu$m. Once etching of the deep trench is accomplished, the process is complete as shown in 112.

FIG. 2 illustrates a cross-sectional view of an exemplary deep opening having an etch depth of approximately 5.5 $\mu$m in a silicon layer with a masking layer over it that was etched using the prior art etching method presented in FIG. 1. A silicon layer 202, which has a masking layer 204 disposed over it, is etched to form a deep trench 206. Masking layer 204 may be a layer of conventional photoresist material, which may be patterned for etching, e.g., through exposure to ultraviolet rays. An etch rate of approximately 1.5 $\mu$m/min is achieved. Deep trench 206, which was etched using the etching method described in FIG. 1, has a number of structural flaws, for example, bowed features 208 in the sidewalls as well as notch-like features 210, which resulted from undercutting of the hard mask.

Other issues that are not directly illustrated in FIG. 2 but may be encountered in the etching of deep trenches involve non-vertical etch profiles, low etch rates, inadequate etch depths, RIE lag, low TEOS/Si selectivity, critical dimension bias, and silicon nonuniformity. Some of these problems may not appear or become severe enough to pose difficulties until attempts are made to etch openings having greater etch depths and higher aspect ratios. It should be appreciated by those skilled in the art that the aforementioned issues will arise as rapid improvements in the industry call for the use of even deeper and narrower openings than are commonly used in today's state of the art technology.

In view of the foregoing, there are desired improved techniques of etching deep and narrow openings in a silicon layer while avoiding some or all of the numerous problems described above.

SUMMARY OF THE INVENTION

To achieve the foregoing and other objects and according to the purpose of the present invention, a method of etching deep openings in a silicon layer in a plasma etching reactor is disclosed. The method includes the steps of providing a semiconductor substrate including the silicon layer into the plasma etching reactor and flowing a gas chemistry for the main etch that includes an oxygen reactant gas, and a helium gas into the plasma etching reactor. The method further includes striking a plasma using the etchant gas chemistry, and then providing a fluorine-containing additive gas, which may include, by way of example, $SF_6$, into the plasma etching reactor subsequent to striking the plasma. The method continues with etching an opening at least partially through the silicon layer using this plasma. In a preferred embodiment, a chlorine-containing chemistry is provided prior to flowing the main etch gas chemistry to etch through a native oxide layer that may be disposed over the silicon layer.

In another embodiment of the present invention, a method of etching ultra deep openings in a silicon layer in a plasma etching reactor is disclosed. The method includes the steps of providing a semiconductor substrate including the silicon layer into the plasma etching reactor and flowing a gas chemistry for the main etch that includes an oxygen reactant gas, a helium gas, and an inert bombardment-enhancing gas into the plasma etching reactor. The method further includes striking a plasma using the etchant gas chemistry, and then providing a fluorine-containing additive gas, which may include, for example, $SF_6$, into the plasma etching reactor subsequent to striking the plasma. The method continues with etching an opening at least partially through the silicon layer using this plasma. In a preferred embodiment, argon is selected as the inert bombardment-enhancing gas and a chlorine-containing chemistry is provided prior to flowing the main etch gas chemistry to etch through a native oxide layer that may be disposed over the silicon layer.

Other aspects and advantages of the invention will become apparent from the following detailed description taken in conjunction with the accompanying drawings, illustrating by way of example the principles of the invention.

DETAILED DESCRIPTION OF THE PREFERRED EMBODIMENTS

Figure 1:
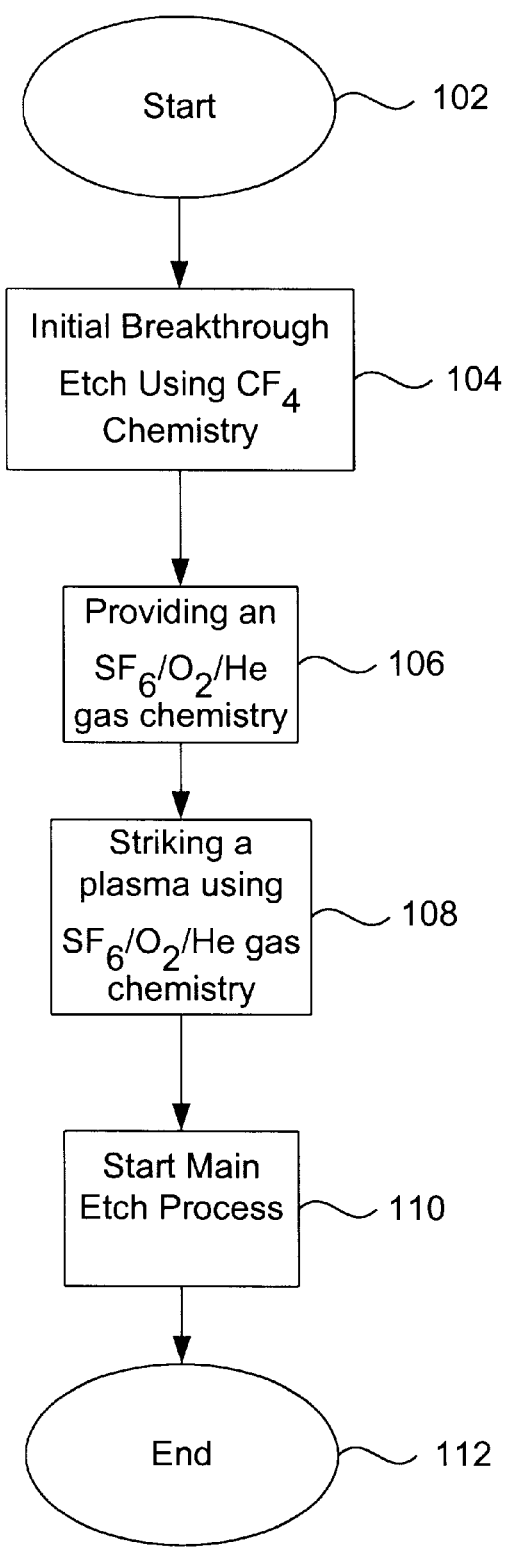
FIG. 1 shows the steps involved in a prior art method of etching deep openings that utilizes a prior art etching gas chemistry.

The present invention will now be described in detail with reference to a few preferred embodiments thereof as illustrated in the accompanying drawings. The inventive etching process in accordance with one aspect of this invention is a complex application that produces deep, high aspect ratio openings with precisely controlled sidewall angles. Etch depths achieved using the inventive process may reach approximately 30 $\mu$m or more, with aspect ratios of greater than about 10:1, some as high as about 35:1. Sidewall angles may generally be greater than approximately 87 degrees.

A preferred result of applying this invention is to achieve a deep opening in the silicon layer having all the desired characteristics such as a substantially vertical profile, high etch rate/depth, minimal RIE lag and critical dimension bias, and high TEOS/Si selectivity and silicon uniformity. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

In accordance with one aspect of the present invention, a method of etching deep openings in a silicon layer in a plasma etching reactor is disclosed. The method includes the steps of providing a semiconductor substrate including the silicon layer into the plasma etching reactor and flowing a gas chemistry for the main etch that includes an oxygen reactant gas, and a helium gas into the plasma etching reactor. The method further includes striking a plasma using the etchant gas chemistry, and then providing a fluorine-containing additive gas that may include, by way of example, $SF_6$, into the plasma etching reactor subsequent to striking the plasma. The method continues with etching an opening at least partially through the silicon layer using this plasma. In a preferred embodiment, a chlorine-containing chemistry is provided prior to flowing the main etch gas chemistry to etch through a native oxide layer that may be above the silicon layer.

In another embodiment of the present invention, a method of etching ultra deep openings in a silicon layer in a plasma etching reactor is disclosed. The method includes the steps of providing a semiconductor substrate including the silicon layer into the plasma etching reactor and flowing a gas chemistry for the main etch that includes an oxygen reactant gas, a helium gas, and an inert bombardment-enhancing gas into the plasma etching reactor. The method further includes striking a plasma using the etchant gas chemistry, and then providing a fluorine-containing additive gas, which may include, by way of example, $SF_6$, into the plasma etching reactor subsequent to striking the plasma. The method continues with etching an opening at least partially through the silicon layer using this plasma. In a preferred embodiment, argon is selected as the inert bombardment-enhancing gas and a chlorine-containing chemistry is provided prior to flowing the main etch gas chemistry to etch through a native oxide layer that may be above the silicon layer.

Figure 3:
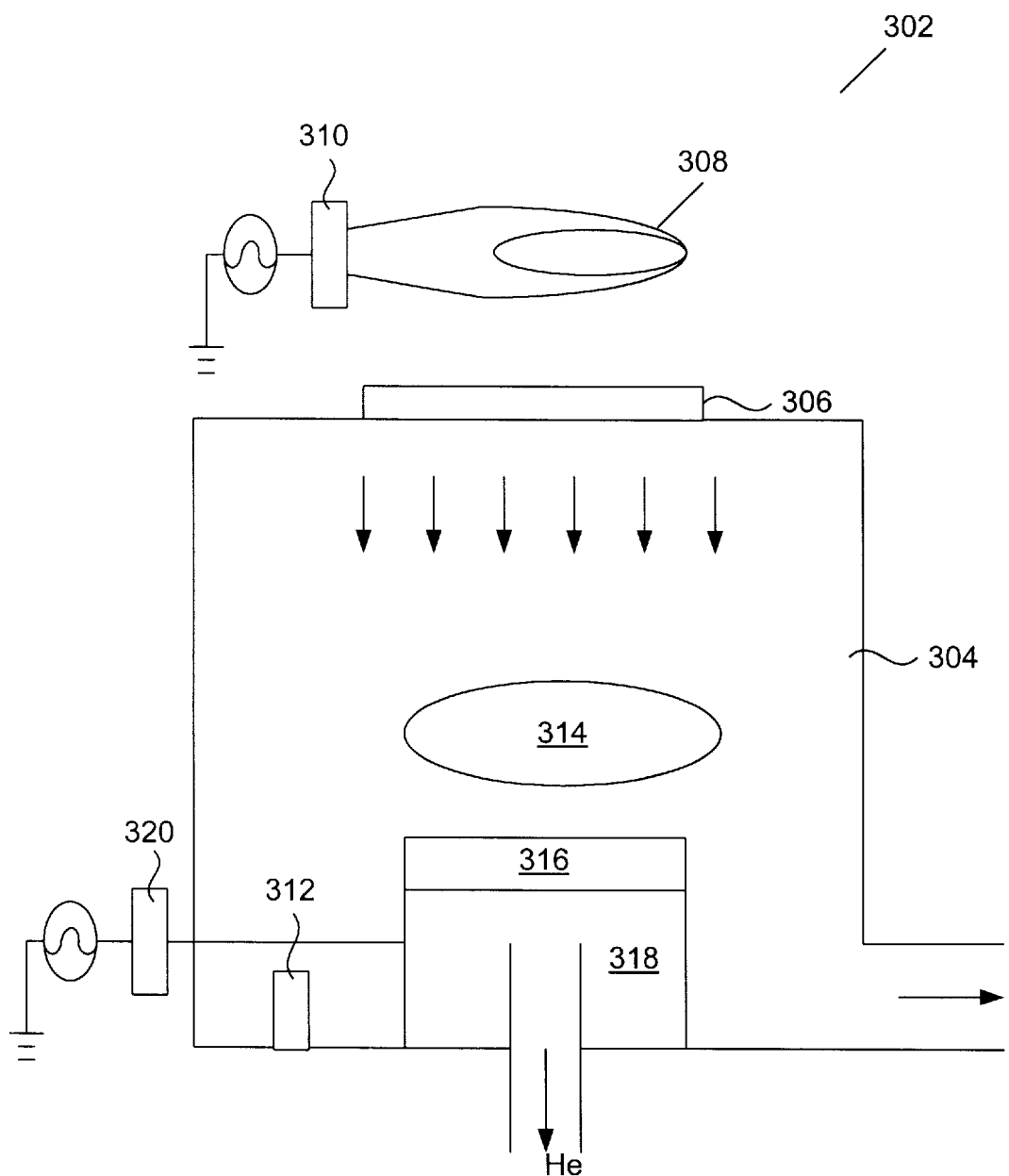
FIG. 3 is a simplified diagram of a plasma reactor that may be suitably employed with the improved gas chemistry in accordance with one aspect of the invention.

In a preferred embodiment, the present invention is employed in an inductively coupled plasma reactor, for example, the TCP™ brand plasma reactors such as the 9400PTX™ plasma reactor, which are available from Lam Research Corporation of Fremont, Calif. FIG. 3 illustrates a simplified schematic of an inductively coupled plasma reactor which represents the preferred plasma processing reactor for practicing the invention. Referring to FIG. 3, a wafer reactor 302 includes a plasma processing chamber 304. On the top surface of the chamber 304, there is disposed a quartz window 306, which serves as a transparent medium to allow RF energy to enter the chamber. A coil 308 positioned above plasma processing chamber 304 emits the RF energy, which is supplied by a power generator 310 that generates power that may range from about 300 W to about 2000 W, preferably between about 400 W and about 1200 W, and more preferably at about 1000 W in one embodiment.

Within chamber 304, the etching gas chemistry is released through a gas inlet 312 into the RF-induced plasma region 314 between quartz window 306 and a wafer 316. The etching gas chemistry may also be released from other ports built into the walls of the chamber itself. Wafer 316 is introduced into chamber 304 and disposed on an electrostatic chuck 318, which acts as the bottom electrode that is driven by a power generator 320. Power generator 320 generates power that may range from about 20 W to about 100 W, preferably between about 20 W and about 30 W, and more preferably at about 25 W in one embodiment. Helium cooling gas may be introduced under pressure (e.g., about 4–14 Torr, preferably about 6–10 Torr, and more preferably at about 8 Torr, for example, in one embodiment) between electrostatic chuck 318 and wafer 316 to act as a heat transfer medium for accurately controlling the wafer's temperature during processing to ensure uniform and repeatable etching results. The temperature of electrostatic chuck 318 may be kept between about 0° C. and about 70° C., preferably between about 15° C. and about 60° C., more preferably about 20° C. in one embodiment, whereas the chamber temperature may be kept between about 20° C. and 70° C., preferably between about 40° C. and about 70° C., more preferably at about 50° C. in one embodiment. During plasma etching, the pressure within plasma processing chamber 304 is preferably kept low, e.g., between about 40 mTorr to about 110 mTorr, preferably between about 50 mTorr to about 100 mTorr, more preferably at about 60 mTorr in one embodiment.

Figure 4:
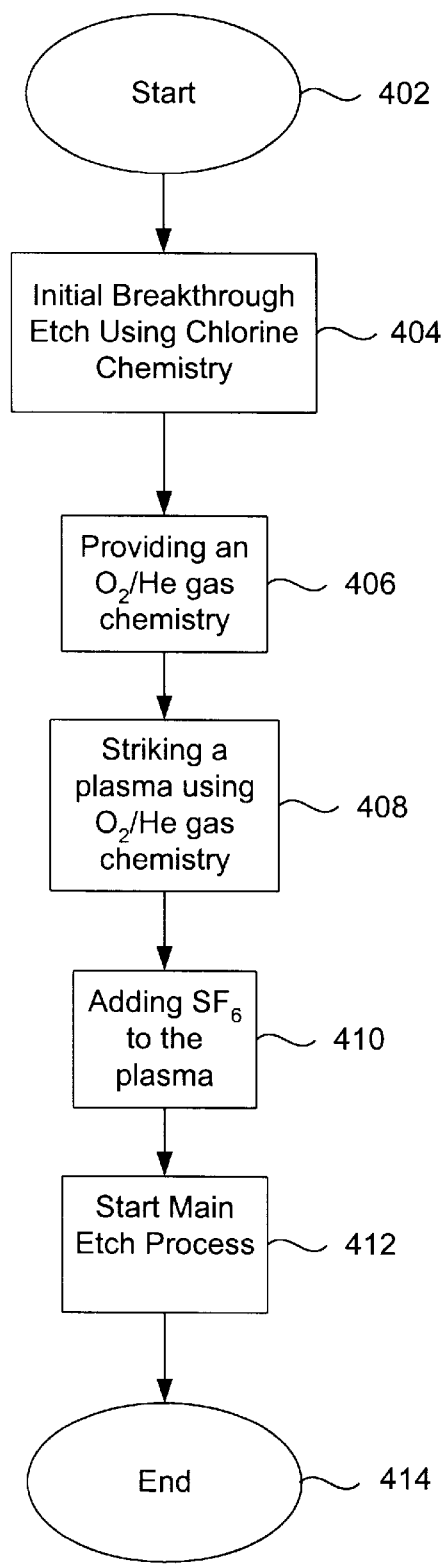
FIG. 4 shows the steps involved in a first inventive method of etching deep openings in accordance with one aspect of the present invention.

FIG. 4 shows the steps involved in a first inventive method of etching deep openings in accordance with one aspect of the present invention. This inventive method starts at 402 when a substrate is placed upon a lower electrode, which may be an electrostatic chuck, in a plasma processing chamber. The lower electrode temperature is maintained at approximately 30° C., which is substantially less than the lower electrode temperature of approximately 50° C. that is provided in the prior art method. A reduced lower electrode temperature is believed to minimize critical dimension bias, which results in a more uniform cross-sectional area along the entire depth of the etched opening, in this example, a CD bias of less than approximately 0.03 is achieved.

A chlorine-containing chemistry is provided for an initial breakthrough etch in 404. This chlorine-containing chemistry was found to be more effective than the fluorine-containing chemistry used in the prior art in achieving the purpose of this initial breakthrough etch, which is to etch through a native oxide layer that is usually formed on the silicon layer when the silicon reacts with the oxygen in the air. The use of a chlorine-containing chemistry is also believed to eliminate the bowed features 208 which were present in the results shown in FIG. 2. In 406, a gas chemistry having oxygen and helium is provided, followed by the striking of a plasma using this gas chemistry in 408. Although a fluorine-containing gas such as $SF_6$ does play a role in this etchant chemistry, this reactive gas element is deliberately excluded during the striking of the plasma to avoid a vertical flash effect that may cause an undercutting of the hard mask and the silicon interface, which in turn may cause a notch-like structure to form along the sidewalls of the opening. The act of striking the plasma absent the presence of $SF_6$ may be sustained for a given time period, for example, seven seconds. After striking the plasma, $SF_6$ is added into the plasma processing chamber in 410, followed by the start of the main etch. This process ends in 414 when the etching of a deep opening is complete. Other gases that may be substituted for $SF_6$ include $C_4F_8$, $CF_4$, $NF_3$, and $CHF_3$.

Figure 2:
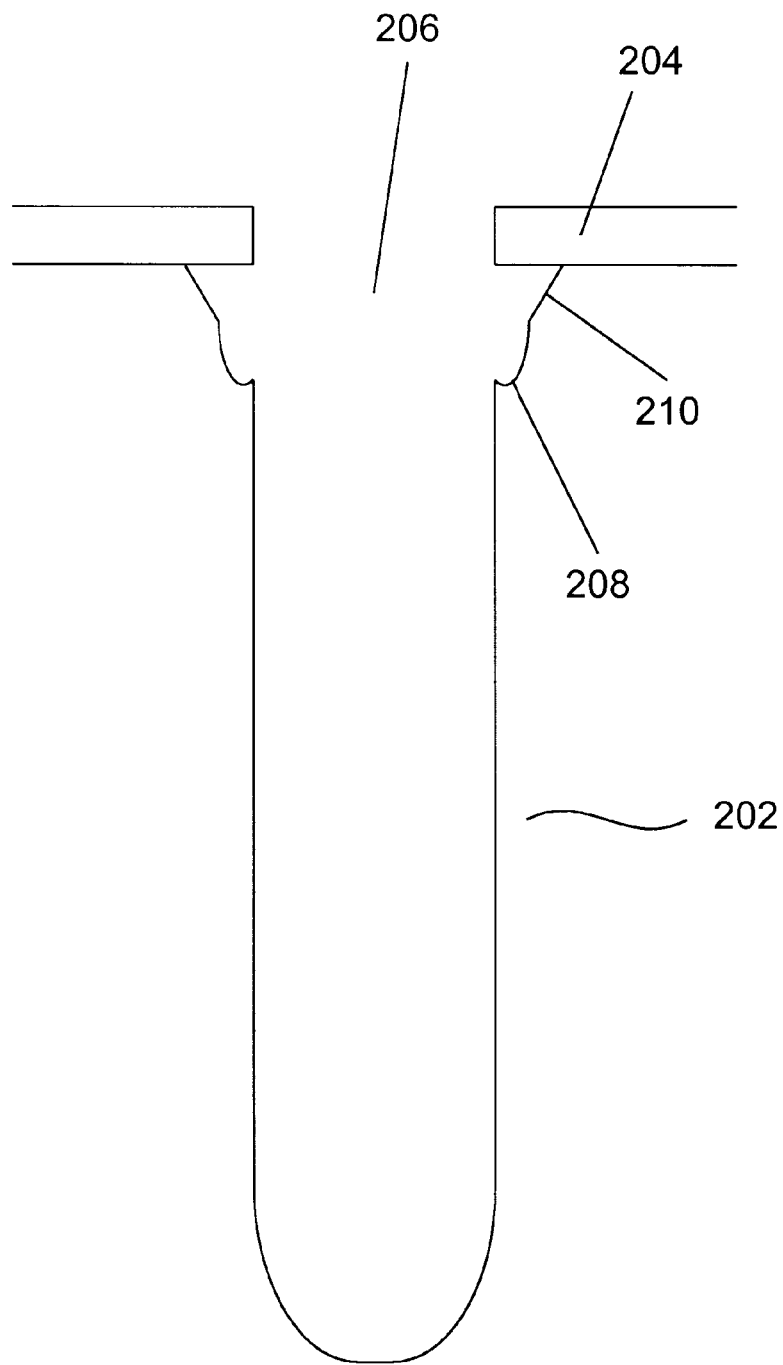
FIG. 2 illustrates a cross-sectional view of a deep opening in a silicon layer that was etched using the prior art etching method.
Figure 5A:
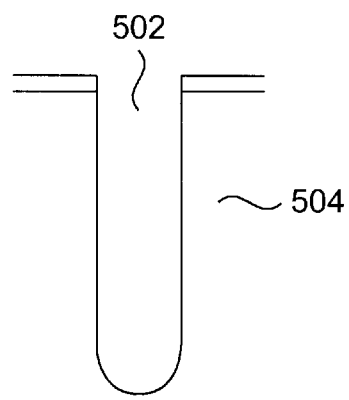
FIG. 5(a) illustrates a cross-sectional view of a deep opening in a silicon layer that was etched using an inventive etching method in accordance with one embodiment of the present invention.

FIG. 5(a) illustrates a cross-sectional view of a deep opening 502 in a silicon layer 504 that was etched using this inventive etching method in accordance with one embodiment of the present invention. These results indicate that this novel method can achieve an increased etch rate of approximately 3.5 $\mu$m/min, and is effective for etching openings with etching depths as deep as about 10 $\mu$m to about 15 $\mu$m without the problems encountered using the prior art methods. For example, deep opening 502, which has an etch depth of approximately 5.5 $\mu$m, has a straight vertical profile, without the problematic characteristics such as the bowed features and the notch-like features that result from undercutting the hard mask that were present in a deep opening etched using the prior art method as depicted in FIG. 2.

Figure 5B:
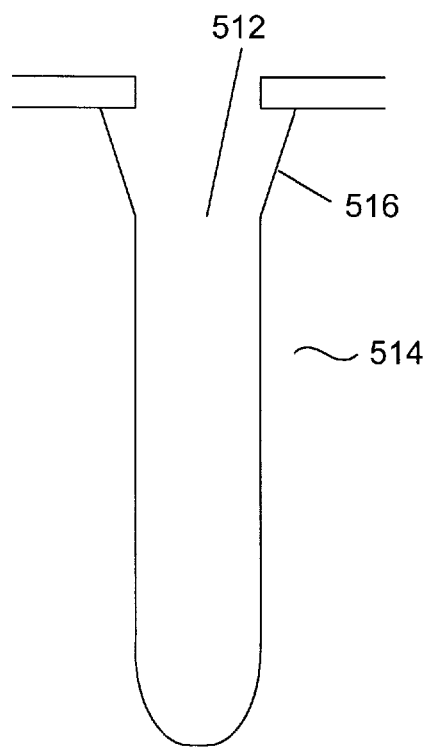
FIG. 5(b) illustrates a cross-sectional view of the result obtained by attempting to etch an ultra deep opening in a silicon layer using the same inventive etching method as FIG. 5(a).

FIG. 5(b) illustrates a cross-sectional view of the result obtained by attempting to etch an ultra deep opening in a silicon layer using largely the same inventive etching method and parameters as FIG. 5(a) except the lower electrode temperature is further reduced to 20° C. in an attempt to further improve the critical dimension control. A deep opening 512 in a silicon layer 514 having an etch depth of approximately 13 $\mu$m is shown in this figure. The average etch rate achieved was approximately 1.6 $\mu$m/min. It is questionable whether the average etch rate calculated in this instance is at all reflective of the actual etch rate, since the etching failed to reach the targeted etch depth of 30 $\mu$m, in fact there was an etch stop at an etch depth of approximately 15 $\mu$m which occurred prior to the end of the designated etch time of 500 seconds. Deep opening 512 still has a largely vertical profile, except near the top surface where sidewalls of the opening is pulled back due to the reoccurrence of the undercutting of the hard mask, which causes a sloped profile 516 from a level where the pulling back begins to the top edge of the etched opening. Therefore, there is a need for another improved method for etching deep openings having large aspect ratios with the capability for etching openings having a depth greater than 15 $\mu$m and having the desired characteristics such as a substantially vertical profile, high etch rate/depth, low critical dimension bias, high TEOS/Si selectivity, minimal RIE lag, and high silicon uniformity.

Figure 6:
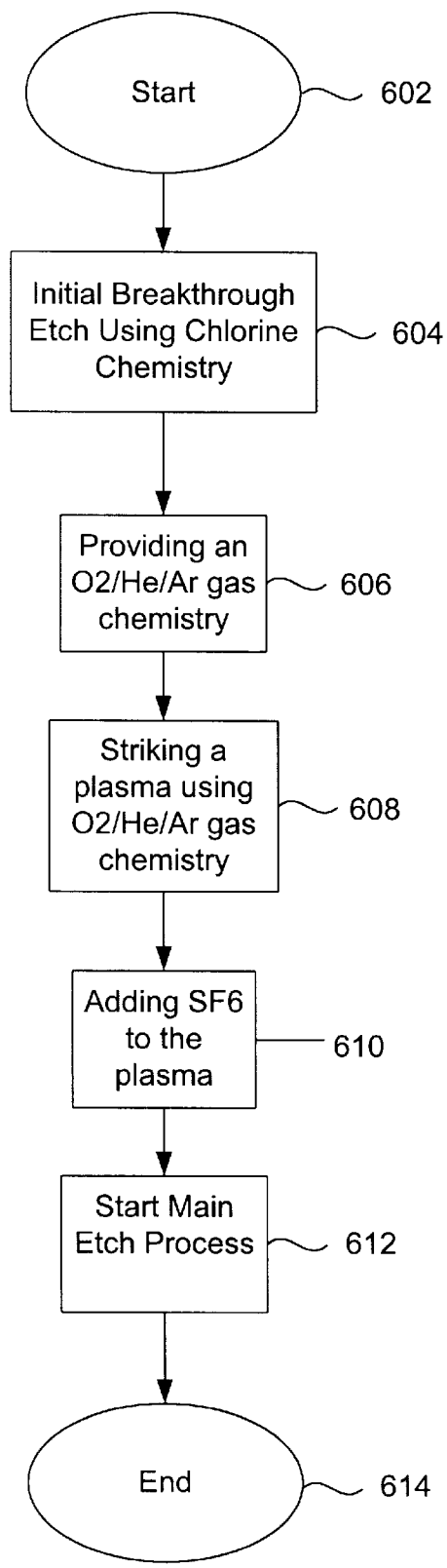
FIG. 6 shows the steps involved in a second inventive method of etching ultra deep openings using a second etching gas chemistry in accordance with another aspect of the invention.

FIG. 6 shows the steps involved in a second inventive method of etching deep openings using a second etching gas chemistry in accordance with another aspect of the invention that begins in 602. A chlorine chemistry is provided for an initial breakthrough etch in 604. In 606, a gas chemistry having an oxygen reactant, helium, and an inert bombardment-enhancing gas such as argon is provided. After flowing this gas chemistry, a plasma is struck using this etchant gas chemistry in 608. Like the previous inventive method, a fluorine-containing reactive gas element does play a role in this etchant chemistry but is deliberately excluded during the striking of the plasma to avoid a vertical flash effect that may cause an undercutting of the hard mask and the silicon interface, which in turn may cause a notch-like structure to form along the sidewalls of the opening. The act of striking the plasma absent the presence of a fluorine-containing chemistry such as $SF_6$ may be sustained for a certain amount of time, for example, seven seconds. After striking the plasma, $SF_6$ is added into the plasma processing chamber in 610, followed by the start of the main etch in 612. This process ends in 614 when the etching of a deep opening is complete.

Figure 7:
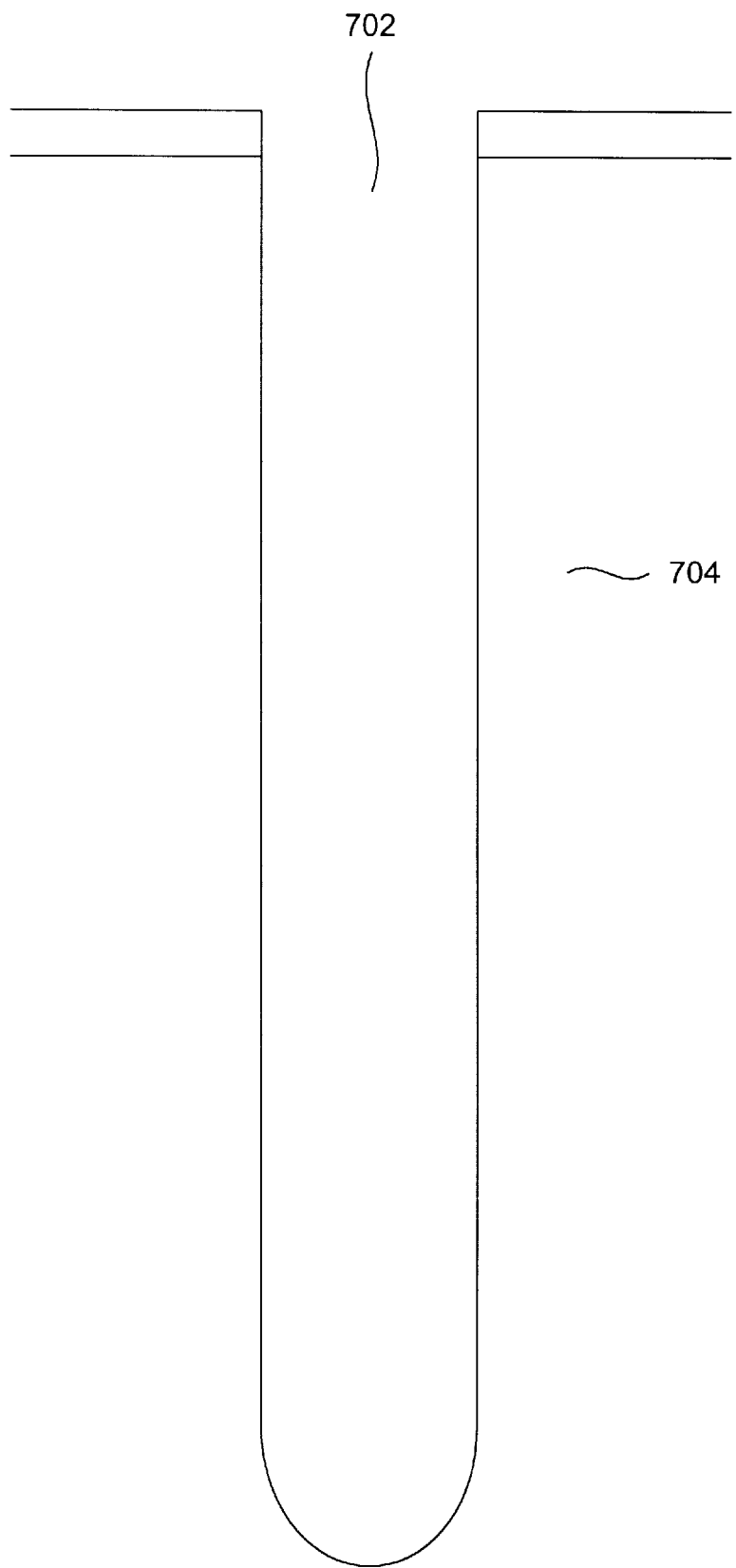
FIG. 7 illustrates a cross-sectional view of an ultra deep opening in a silicon layer that was etched using the second inventive etching method in accordance with one embodiment of the present invention.

FIG. 7 illustrates a cross-sectional view of an opening in a silicon layer that was etched using the second inventive etching method in accordance with one embodiment of the present invention. To achieve commercially acceptable etch results, the top power was increased and the chamber pressure was decreased in one embodiment to bolster the etching process and therefore minimize the possibility of an etch stop. The addition of argon also played a contributory role in enhancing the ion bombardment. In this figure, an ultra deep opening 702, approximately 30 $\mu$m, having a high aspect ratio greater than approximately 30:1, has been etched into a silicon layer 704. An etch rate of 3.6 $\mu$m/min was reached in this instance. Moreover, the sidewall profile was substantially vertical with good critical dimension control, as can be seen in this figure, which is very difficult to achieve in etching openings of comparable depths and aspect ratios.

An important feature of this inventive method of etching ultra deep openings is the inclusion of an inert bombardment-enhancing gas such as argon or xenon. It is believed that the addition of this inert bombardment-enhancing gas might possibly play a role in eliminating the undercutting of the hard mask, which in turn helps in controlling the sidewall profile. Adding a heavy inert gas such as argon to the total gas flow is also believed to contribute to the improvement of the RIE lag problem. RIE lag is the etch rate difference between different openings that are being etched. Usually RIE lag occurs in openings having different feature sizes, but in some cases, RIE lag occurs in features of the same size. The latter situation is believed to occur when there are not enough reactive ions in the openings to continue the etching. The addition of an inert bombardment-enhancing gas to the total flow alleviates that problem by enhancing ion bombardment in the etching process, thereby reducing an etch stop condition while not affecting the polymer formation and profile.

Although heavy gases such as argon are used in oxide etching, they are not often used in silicon etching. The addition of a heavy inert gas such as argon to enhance the ion bombardment is nonobvious because in etching openings of high etch depths and aspect ratios, it is evident that enhancing ion bombardment would not be an obvious approach, especially given that the thickness of the masking layer that can be put on the silicon layer decreases with the reduction in feature size and stronger bombardment that would wear away the masking layer before etching is complete would not be a desired effect of the process.

Notwithstanding the effects of enhanced ion bombardment, another advantage of these improved etching methods is its surprising selectivity to a masking material such as TEOS that is used to mask the silicon layer for the purpose of etching. Given that the thickness of the masking layer that can be put on the silicon layer decreases with the reduction in feature size, the selectivity of the silicon to TEOS becomes a very important factor in the etching process. It is imperative that the TEOS layer does not completely wear away before the etching of a deep and narrow opening in the silicon layer is completed, in fact, high selectivity to masking material is required to achieve openings with the proper geometrical aspect. Even with the addition of a bombarding agent (such as Ar), it has been found that the improved etching gas chemistry provides a silicon:TEOS selectivity ratio of greater than approximately 60:1, which is much higher than the selectivity ratio of approximately 25:1 or less provided by the prior art etching gas chemistry (which does not employ an inert bombardment-enhancing gas such as Ar).

Besides having high etch rates, superior etch profile control, and high selectivity to the masking layer, another inherent advantage to these improved etching methods is that the inventive methods each involve only one main etch step without a polymerizing step, and therefore are more direct and cleaner processes in comparison with methods commonly used in the industry to etch deep openings which involve etching down a predetermined depth, followed by a polymerizing step for passivation, and then repeating this alternating sequence until the desired etch depth is reached. In contrast, these improved etching methods advantageously allow for the etching of an opening with a desired etch depth in one main etch.

EXAMPLES

In the tables that follow, suitable parameters for etching through an exemplar silicon wafer are shown. Provided for each parameter are the preferred approximate range, the more preferred approximate range, and the exemplary values for four separate processes A, B, C, and D. The results obtained through processes A, B, C, and D are shown respectively in FIGS. 2, 5(a), 5(b) and 7. Process A is the prior art process.

The approximate process parameters shown therein are generally suitable for etching a 6-inch wafer on the aforementioned TCP™ brand 9400PTX™ plasma reactor. It should be readily apparent and within the skills of one skilled in the art that the parameters may be scaled and/or modified as appropriate to etch a substrate having a different dimension or pattern density or to conform to the requirements of a specific plasma reactor.

Table 1 provides approximate ranges of suitable parameters for use in the plasma reactor such as the chamber pressure (in mTorr), the top power and bias power (in W), the chamber temperature and lower electrode temperatures (in degrees Celsius), the helium pressure at the electrostatic chuck (in Torr), as well exemplary parameters used to obtain the etching results shown in the FIGS. 2, 5(a), 5(b), and 7. Table 2 provides the approximate preferred and approximate more preferred ranges of flow rates (in sccm) of some of the basic components of an exemplar etching gas chemistry used in the inventive method, e.g., $Cl_2$, $SF_6$, $O_2$, He, and Ar, as well as exemplar recipes for the specific gas chemistries used to obtain the etching results shown in the figures. Table 3 provides the approximate preferred and approximate more preferred ranges and exemplar parameters of flow rates of some basic components such as $Cl_2$, $O_2$, He, and Ar in an exemplar etching chemistry used in the inventive method, relative to the $SF_6$ flow rate in percentage form.

It is understood that some of the gas components may or may not be present in certain specific gas chemistries, for example, $Cl_2$ is used to substantially replace the $CF_4$ used for the initial breakthrough etch in the prior art process, so it is not a primary component of the breakthrough etch gas chemistry used in process A. Moreover, this gas chemistry components listed in Table 2 are by no means all-inclusive, other types of gases may also be included in a gas chemistry to achieve certain purposes or to meet the particular needs of the specific type of etching equipment used. However, the most preferred gas chemistry used in the main etch for etching an ultra deep opening does not include any significant amount of additional gases other than those provided in Table 2, namely, $SF_6$, $O_2$, He, and Ar.

TABLE 1

| Etching Parameters | Approximate Preferred | Approximate More Preferred | Approximate Exemplary Parameters | | | |
|---|---|---|---|---|---|---|
| | | | A | B | C | D |
| Chamber Pressure (mTorr) | 40–110 | 50–100 | 80 | 80 | 80 | 60 |
| Top Power (W) | 300–2000 | 400–1200 | 500 | 500 | 500 | 1000 |
| Bias Power | 10–100 | 20–30 | 25 | 25 | 25 | 25 |
| Backside Helium Pressure (Torr) | 4–14 | 6–10 | 8 | 8 | 8 | 8 |
| Lower Electrode Temperature (° C.) | 0–70 | 15–60 | 50 | 30 | 20 | 20 |
| Chamber Temperature (° C.) | 20–70 | 40–70 | 60 | 50 | 50 | 50 |

TABLE 2

| Etching Gas Chemistry Component/Flow Rates (sccm) | Approximate Preferred | Approximate More Preferred | Approximate Exemplary Parameters | | | |
|---|---|---|---|---|---|---|
| | | | A | B | C | D |
| $Cl_2$ (sccm) | 50–200 | 80–120 | N/A | 100 | 100 | 100 |
| $SF_6$ (sccm) | 20–90 | 35–55 | 45 | 45 | 45 | 45 |
| $O_2$ (sccm) | 10–70 | 25–45 | 35 | 35 | 35 | 35 |
| He (sccm) | 100–400 | 150–250 | 200 | 200 | 200 | 200 |
| Ar (sccm) | 100–400 | 150–250 | N/A | N/A | N/A | 200 |

TABLE 3

| Etching Gas Chemistry Component Flow (% Relative to $SF_6$ Flow) | Approximate Preferred | Approximate More Preferred | Approximate Exemplary Parameters |
| --- | --- | --- | --- |
| $Cl_2$ (%) | 110–330 | 180–270 | 222 |
| $O_2$ (%) | 40–120 | 60–90 | 80 |
| He (%) | 200–650 | 350–550 | 444 |
| Ar (%) | 200–650 | 350–550 | 444 |

While this invention has been described in terms of several preferred embodiments, there are alterations, permutations, and equivalents which fall within the scope of this invention. It should also be noted that there are many alternative ways of implementing the methods and apparatuses of the present invention. For example, this method may be utilized to etch a deep opening in a polysilicon layer as well as a pure silicon wafer. Also, the etch depth of an opening that is etched using the inventive method is by no means limited to the examples given in the preferred embodiments. By utilizing the method of the present invention and making proper adjustments to some of the etching parameters, it is expected that openings with greater etch depths having other desirable characteristics such as a vertical profile among others will be achieved. It is therefore intended that the following appended claims be interpreted as including all such alterations, permutations, and equivalents as fall within the true spirit and scope of the present invention.

What is claimed is:

1. A method of etching a silicon layer in an inductively coupled plasma etching reactor to form an ultra deep trench, said ultra deep trench having an etch depth of at least 10 $\mu$m, said method comprising:

providing a semiconductor substrate into said inductively coupled plasma etching reactor, said semiconductor substrate including said silicon layer;

flowing an etchant gas chemistry consisting essentially of a helium gas, an $O_2$ gas, and an argon gas into said inductively coupled plasma etching reactor;

striking a plasma using said etchant gas chemistry;

providing an $SF_6$ gas into said inductively coupled plasma etching reactor subsequent to said striking said plasma, wherein a flow ratio of said helium gas to said $SF_6$ gas is about 350% to about 550%, a flow ratio of $O_2$ to said $SF_6$ gas is about 60% to about 90%, and a flow ratio of said argon gas to said $SF_6$ gas is about 350% to about 550%; and etching said ultra deep trench at least partially through said silicon layer.

2. The method of etching a silicon layer in an inductively coupled plasma etching reactor to form an ultra deep opening as in claim 1, wherein a native oxide layer is disposed over said silicon layer and a chlorine-containing gas chemistry is flowed into said inductively coupled plasma etching reactor, said chlorine-containing gas chemistry being used to etch through said native oxide layer prior to said flowing of said etchant gas chemistry for said etching said silicon layer.

3. The method of etching a silicon layer in an inductively coupled plasma etching reactor to form an ultra deep opening as in claim 1, wherein a flow ratio of said argon gas to said $SF_6$ gas is about 350% to about 550%.

4. The method of etching a silicon layer in an inductively coupled plasma etching reactor to form an ultra deep opening as in claim 1, wherein said etching of said ultra deep opening continues down to an etch depth of between about 30 $\mu$m and about 60 $\mu$m.

5. The method of etching a silicon layer in an inductively coupled plasma etching reactor to form an ultra deep opening as in claim 1, wherein said striking of said plasma is sustained for a time period between about 5 seconds and about 10 seconds.

* * * * *